United States Patent [19]
Hoult

[11] Patent Number: 6,107,798
[45] Date of Patent: Aug. 22, 2000

[54] TUNING AND MATCHING AN IMPEDANCE

[75] Inventor: David Ian Hoult, Winnipeg, Canada

[73] Assignee: National Research Council of Canada, Ottawa, Canada

[21] Appl. No.: 08/835,900

[22] Filed: Apr. 10, 1997

[51] Int. Cl.$^7$ .................................................. G01V 3/00
[52] U.S. Cl. .......................................... 324/318; 324/322
[58] Field of Search .................................. 324/318, 322; 333/17, 17.3

[56] References Cited

U.S. PATENT DOCUMENTS

| | | | |
|---|---|---|---|
| 3,891,947 | 6/1975 | Debost et al. ............................. | 333/17 |
| 4,638,253 | 1/1987 | Jaskolski et al. ....................... | 324/318 |
| 4,890,061 | 12/1989 | Haragashire ............................ | 324/322 |
| 4,951,009 | 8/1990 | Collins ................................... | 333/17.3 |
| 5,631,611 | 5/1997 | Luu ....................................... | 333/17.3 |

OTHER PUBLICATIONS

Article—"Audio Interpolating Phase Shifter" (2 pages).
Article—"Biomedical Magnetic Resonance Technology" (6 pages).
Article—"A High–Sensitivity, High–$B_1$ Homogeneity Probe for Quantitation of Metabolites" (7 pages).

*Primary Examiner*—Donald E. McElheny, Jr.
*Assistant Examiner*—Brij B. Shrivastav
*Attorney, Agent, or Firm*—Adrian D. Battison; Murray E. Thrift

[57] ABSTRACT

In an MRI system including a source of a high frequency oscillating current having a required characteristic impedance and a probe having an impedance different from said required characteristic impedance and an adjustment circuit for adjusting the impedance of the probe to the required characteristic impedance there is provided an automatic circuit for matching and tuning the impedances: The circuit includes a first adjustable element and a second adjustable element arranged such that adjustment of the first and second elements causes adjustment of both a resistive component and a reactive component of the impedance and such that, over at least a part of a range, adjustment of the first element while the second element remains constant generates a change in the impedance which is substantially orthogonal to a change in the impedance obtained by adjustment of the second element while the first element remains constant and such that adjustment of the first element to a first required adjustment position and adjustment of the second element to a second required adjustment position causes the impedance of the probe to be adjusted to said required characteristic impedance. A detection circuit provides two separate output values which are orthogonal to one another and which are indicative of a difference in the impedance of the probe from said required characteristic impedance. The output values are indicative of a difference of the first element from the first required adjustment position and a difference of the second element from the second required adjustment position. The values are used for controlling respectively the first and second elements.

11 Claims, 7 Drawing Sheets

Mode
Remote
Autotune ● ● Manual

Sensitivity

TUNING AND MATCHING AN IMPEDANCE

TUNING AND MATCHING AN IMPEDANCE

This invention relates to an automated method for transforming an impedance having a resistive component and a reactive component to a required characteristic impedance.

BACKGROUND OF THE INVENTION

Background information is disclosed in the following book, articles and patent:

1. C-N. Chen and D. I. Hoult, "Biomedical Magnetic Resonance Technology", Adam Hilger, Bristol, U. K., 1989.
2. D. I. Hoult and R. Deslauriers, "A High Sensitivity, High $B_1$ Homogeneity Probe for Quantitation of Metabolites", Magnetic Resonance in Medicine, 16, 411, 1990.
3. D. I. Hoult, "Audio Interpolating Phase Shifter", Electronic Design, 44125, 115, December, 1996.
4. U.S. Pat. No. 4,890,062 (Haragashira, issued Dec. 26th, 1989).

The present invention is particularly but not exclusively concerned with transforming the impedance of a probe of a magnetic resonance imaging system so that the impedance of the probe matches the required characteristic impedance of the source of radio frequency current used to power the probe.

Nuclear magnetic resonance imaging (MRI) has become one of the most powerful non-invasive diagnostic tools available. In MRI a person is placed within a strong magnetic field so that the nuclei in the body become aligned with the field. The transient application of a second, albeit alternating, magnetic field, this time in a direction perpendicular to the first field, causes the nuclei to be thrown out of alignment and consequently to precess, thereby producing a signal used in imaging. The brief application of the second field is accomplished by putting a large radio frequency (r.f.) alternating current through a set of coils placed about, or close to, the person. Generally, although not necessarily, the same coils are used to receive by electromagnetic induction the signal from the precessing nuclei.

One of the essential prerequisites for successful operation of the MRI system is that the impedance of the coils (very roughly of the order of 75 ohm reactance and 1 ohm resistance) be transformed so as to equal the characteristic impedance of the source of the r.f. current (typically 50 ohm resistive via the intermediary of a connecting coaxial cable having a characteristic impedance that is also 50 ohm), thereby maximizing the current flow in the coils. As the coil impedance is complex, comprising both reactance and resistance, and most importantly, may change slightly (both in reactance and resistance) as a patient is inserted in the coil or indeed from person to person according to the latter's size and electrical conductivity, two variables are needed to transform the impedance to the desired value. Thus, in one well-known implementation, two variable capacitors are used. The first is placed in parallel with the coils, thereby causing the ensemble to resonate at a frequency close to the magnetic resonance frequency. This capacitor is commonly referred to as the "tuning" capacitor. The second variable capacitor, commonly known as the "matching" capacitor, is connected between one end of the tuning capacitor and an input terminal. A connection is also made between the other end of the tuning capacitor and a second input terminal ("ground"). Tedious adjustment of the two capacitors in a repetitive manner then allows the input impedance of the assembly or "probe", as measured between the two terminals, to be set to the desired value. Some skill is needed in this process as the adjustment of one of the capacitors varies the effect of the other; in short the adjustments are interdependent.

It should be noted that without this process of "tuning and matching" i.e. impedance transformation, both stimulation of the magnetic resonance phenomenon and reception of the ensuing signal are poor. It should be further noted that several well-known variants of this impedance transformation scheme exist, including: splitting the matching capacitance in two and placing two variable ganged capacitors between the ends of the tuning capacitor and the terminals; placing matching and tuning capacitors in series with the coils and one another and connecting the current source across the matching capacitor; the latter configuration with the tuning capacitance split into two and two ganged capacitors placed in series and on either side of the matching capacitor; etc. Further details may be found in the book by Chen and Hoult. However, all such schemes have the same goal—to transform appropriately the impedance of the coils with the aid of two or more variable capacitors.

The tedium of tuning and matching has existed for many years and has received attention at various times over that period with no practical solution becoming available for assisting or automating this adjustment procedure. Until now, therefore, the adjustment procedure has relied upon the skill of the technician in providing the necessary manual adjustments of the two (or more) capacitors to obtain the required characteristic impedance.

One attempt to automate this procedure is set out in U.S. Pat. No. 4,890,062 (Haragashira—Issued Dec. 26, 1989). This patent discloses a technique in which a detector is used to obtain voltages proportional to the resistive (real) and reactive (imaginary) components of the impedance. These signals are then arranged to actuate a controller which supplies a control signal to change appropriately the tuning and matching capacitors. However, the technique proposed is complex and has not led to any commercial operation. Further, it may be shown to be ineffective for certain combinations of tuning and matching capacitance. In effect the technique has been abandoned.

SUMMARY OF THE INVENTION

It is one object of the present invention, therefore, to provide an improved method for automatically adjusting impedance.

According to one aspect of the invention there is provided a method for adjusting an impedance comprising:

providing a source of a high frequency oscillating current, the source having a required characteristic impedance;

providing a probe to be connected to the source for generating an electromagnetic field in response to the current, the probe having an impedance different from said required characteristic impedance;

providing as part of the probe an adjustment circuit for adjusting the impedance of the probe to the required characteristic impedance;

providing in the adjustment circuit a first adjustable element and a second adjustable element arranged such that adjustment of the first and second elements causes adjustment of both a resistive component and a reactive component of the impedance;

arranging the first and second elements such that, over at least a part of a range of adjustment of the first and second elements, adjustment of the first element while the second element remains constant generates a change in the impedance which is substantially orthogonal to a change in the impedance obtained by adjustment of the second element while the first element remains constant and such that adjustment of the first element to a first required adjustment position and adjustment of the second element to a second required adjustment position causes the impedance of the probe to be adjusted to said required characteristic impedance;

providing a detection circuit responsive to the impedance of the probe and causing the detection circuit to provide a first and a second separate output values which are orthogonal to one another and which are indicative of a difference in the impedance of the probe from said required characteristic impedance;

arranging the output values such that the first is indicative of a difference of the first element from the first required adjustment position and such that the second is indicative of a difference of the second element from the second required adjustment position;

and using the first and second output values for controlling respectively the first and second elements.

Preferably the first and second elements are arranged such that the parts of their ranges at which the changes are orthogonal encompass the first and second required adjustment positions that give the required characteristic impedance.

Preferably the first and second elements are arranged such that, at no points in the range, are the changes obtained by adjustment of the first and second elements substantially parallel.

Preferably the first and second values are arranged such that each is separately indicative of a respective one of the resistive and reactive components of the impedance.

Preferably the method includes providing an orthogonal display of the first and second values.

Preferably said first and second separate output values of the detection circuit are derived from an oscillating signal subject to in-phase and quadrature (I/Q) phase-sensitive detection.

Preferably the oscillating signal is derived from a 180° hybrid bridge.

Preferably each adjustment element of the adjustment circuit comprises an individual component of the circuit, the value of which can be adjusted independently of the other of the components.

Preferably the probe comprises a transmitter inductor coil connected in parallel with a variable capacitor defining the first adjustable element, a subsidiary inductor coil arranged for varying mutual inductance between the transmitter inductor and the subsidiary inductor and a second capacitor connected in series with the subsidiary inductor, the second circuit element being defined by the variable mutual inductance, the current being connected from the source in series with the subsidiary inductor coil and the second capacitor.

Preferably the first and second elements are arranged such that, over at least a part of a range of adjustment of the first and second elements, the movement of the first element that changes the impedance of the probe from its desired value to a new value has no effect, to first mathematical order, upon that dependent variable which is representative of the value of the second element of the adjustment system and the movement of the second element of the adjustment system that changes the impedance of the probe from its desired value to a second new value has no effect, to first mathematical order, upon that dependent variable which is representative of the value of the first element of the adjustment system.

Preferably the first and second values are linearly combined to produce new first and second values, still mutually orthogonal, such that each is separately indicative of a respective one of the first and second adjustable elements.

Preferably the detection circuit generates an oscillating signal that is analyzed to generate said first and second separate output values using in phase and quadrature (I/Q) phase sensitive detection and wherein the phase of the detection process is adjusted such that the first value I is representative of a difference of the first element from the first required adjustment position and such that the second value Q is representative of a difference of the second element from the second required adjustment position.

One embodiment of the invention will now be described in conjunction with the accompanying drawings in which:

BRIEF DESCRIPTION OF THE DRAWINGS

In the drawings like characters of reference indicate corresponding parts in the different figures.

DETAILED DESCRIPTION

Figure 1:
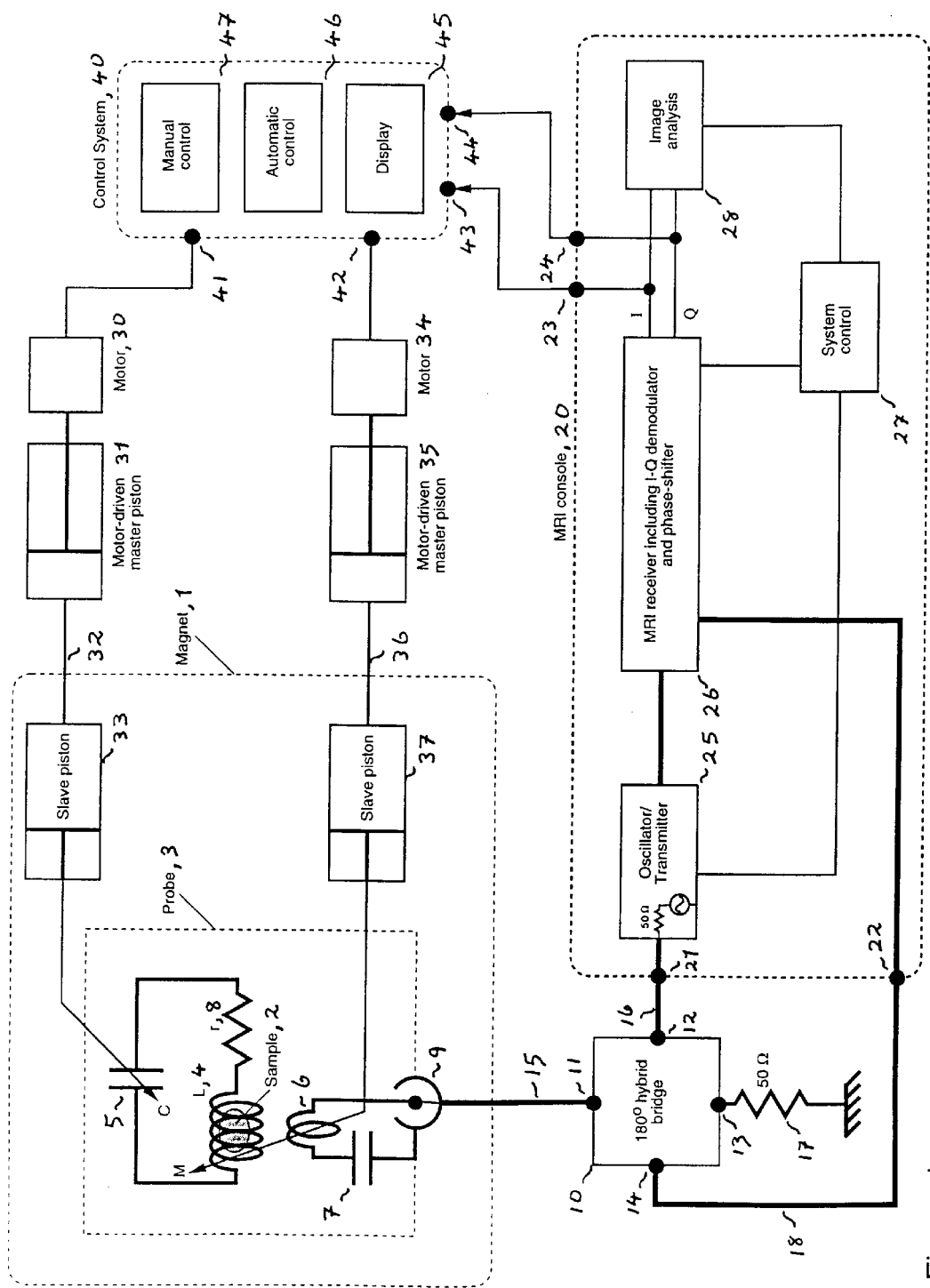
FIG. 1 is a schematic illustration of a magnetic resonance imaging system including an impedance tuning and matching system for the probe according to the present invention.

FIG. 1 shows schematically both elements of a magnetic resonance imaging system and of the probe impedance tuning and matching system according to the present invention.

The MRI system includes a magnet 1 within which is placed a sample 2. That sample may be a person. A probe 3 includes: main coils 4 for generating a Radio frequency magnetic field at the sample or for receiving signals from the sample. The main coils 4 have a small resistance 8; a variable tuning capacitor 5, a movable or rotatable matching coil 6 that couples variably to the main coils 4 by mutual inductance; a fixed capacitor 7 that approximately cancels the reactance of the matching coil at the magnetic resonance frequency. The matching coil 6 and its tuning capacitor 7 are connected to a coaxial terminal 9 that allows passage of current into or out of the probe 3.

The current needed to produce the radio frequency magnetic field that stimulates the magnetic resonance phenomenon is communicated to the probe 3 through a coaxial cable 15. In normal operation of the magnetic resonance imaging system, this cable is connected via a transmit/receive switch to a terminal 21 and thence to a magnetic resonance transmitter 25 when the radio frequency magnetic field is required, and to a receiver 26 via a terminal 22 when signal is being received from the sample. However, in the present application, the transmit/receive switch has been temporarily replaced. Thus the cable 15 is connected to a terminal 11 of an 180° hybrid bridge. This bridge has four terminals 11, 12, 13 and 14, and is driven at terminal 12 with a small electrical signal at the magnetic resonance frequency derived from the oscillator/transmitter 25 via coaxial cable 16. Terminal 13 of the bridge is terminated with a resistor 17, typically 50 ohms, and terminal 14 passes a signal, proportional to the difference in the voltages at terminals 11 and 13, to the magnetic resonance receiver 26 via coaxial cable 18. Thus when the impedance of the probe 3 is 50 ohms resistive, the output of the bridge 10 is zero.

Schematically, the MRI system console indicated at 20 has four terminals 21, 22, 23 and 24. Terminal 21 presents an output signal at the magnetic resonance radio frequency from oscillator/transmitter 25, while terminal 22 passes received signal to receiver 26. The latter has the ability to produce from the aforesaid signal at terminal 22 in-phase and quadrature phase-sensitively detected signals I and Q at terminals 23 and 24. I-Q detection devices are available in the prior art and may be analog devices or a digital equivalent that presents sampled signals. However one suitable example of an arrangement of this type is shown and described in detail in copending application Ser. No. 08/810941 filed Feb. 27th 1997 by the present inventor and the disclosure of this application is incorporated herein by reference. The console 20 includes a system for image analysis 28 and a system controller 27 whose function includes control of the amplitude of the output from oscillator/transmitter 25 and control of the phase of the two quadrature outputs from the receiver 26. Both the system for image analysis and that for control may be single or multiple computers.

As the MRI system is well known to those skilled in the art, no further detailed description of this system will be included herein. The present invention relates to the matching and tuning of the probe 3 and this arrangement will therefore be described in more detail as follows.

The probe 3 is illustrated as including an inductor 4 and a resistor 8 and it can be appreciated that the inductor 4 and resistor 8 in effect comprise the main coils for transmitting or receiving which have an impedance represented in its reactive component by the inductor 4 and its resistive component by the resistor 8.

The oscillator/transmitter 25 has a source impedance which is typically an impedance having a reactive component of zero and resistive component of 50 ohms. It is well known that it is necessary to transform the impedance of the main coils 4, 8 to match this source impedance for proper and effective transmission of radio frequency power from the transmitter to the main coil. To this end, all coaxial cables employed have a characteristic impedance of 50 ohms so that they do not alter the effective source impedance of the transmitter.

The main coils 4, 8 are connected in parallel with a first variable circuit element comprising a variable capacitor 5. The variable capacitor is actuated by a hydraulic actuator 33, a slave piston controlled by a master cylinder 31 driven by an electric motor 30. The motor 30 is located some distance from the magnet as it will not function in a strong magnetic field, and thus only hydraulic fluid is communicated into the magnet via lines 32 for the hydraulic actuator 33 to effect movement of the variable capacitor 5. The pistons employed in the hydraulic system are of the well-known double-acting type wherein the slave piston is always "pushed" by fluid no matter whether it moves backwards or forwards. This allows the fluid to be kept under pressure, thereby avoiding leaks and the formation of air bubbles.

Figure 2:
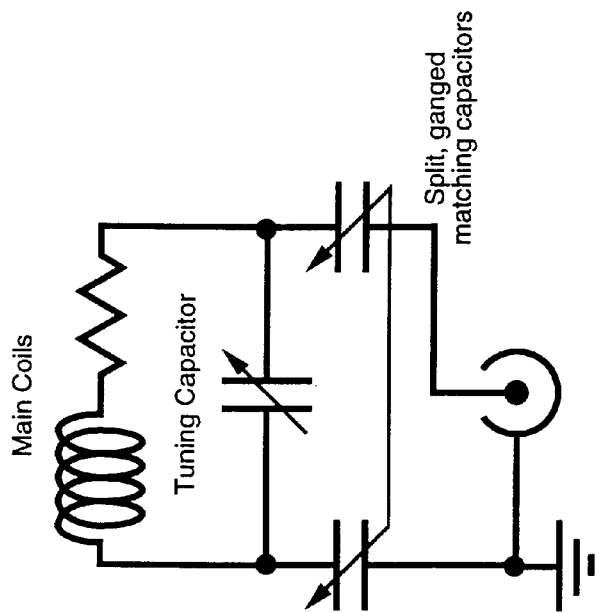
FIG. 2A shows a conventional probe with its tuning and matching capacitors and FIG. 2B shows one variant that functions identically electrically insofar as the present application is concerned.
Figure 2:
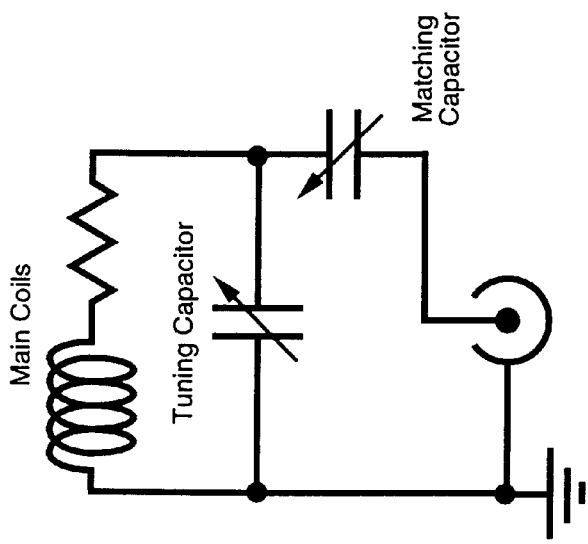

A second variable circuit element comprises an inductor 6 which is movable relative to the main coils 4, 8 of the probe 3 so as to vary the mutual inductance between the inductors 4 and 6. It can be appreciated that the inductor 6 is in effect the matching coil with its resistance neglected, as the latter has negligible effect on the tuning and matching process. (The matching coil's resistance—typically 0.1 ohm—is essentially in series with the source impedance of the transmitter—50 ohms—when the probe is connected thereto and may be ignored.) Fixed capacitor 7 is connected in series with the inductor 6 so as to cancel the latter's reactance at the magnetic resonance frequency to an accuracy of one per cent or better. The inductor 6 generally exhibits negligible change in √impedance with insertion or change of sample as it is distant from the latter. The connections to capacitor 7 and inductor 6 in series are brought to coaxial terminal 9. Thus radio frequency power applied at terminal 9 (normally from the transmitter) creates a current in inductor 6 which in turn creates an alternating magnetic field. This field induces an e.m.f. in the main coil, inductor 4, the size of the e.m.f. being dependent on the current flowing in the matching coil 6 and the amount of mutual inductance between the two inductors 4 and 6. When the reactance of inductor 4 is precisely canceled (typically to an accuracy of 0.1%) by the negative reactance of capacitor 5, a large current flows through inductor 4, thereby creating the large alternating magnetic field needed to stimulate the sample. The size of the field is greatest when the mutual induction is adjusted so that the impedance of the probe, as measured at terminal 9, is 50 ohms resistive. The method of probe construction presented here—coupling by mutual induction rather than by direct connection through a capacitor—is not as well-known as that of FIG. 2, but nevertheless is in the book by Chen and Hoult. It is more difficult to construct a probe in this manner, as it is mutual inductance that must be varied (variable capacitors for MRI use are available commercially). However, it is shown by Hoult and Deslauriers that to first order, tuning and matching adjustments are independent with this design, and it will be seen that it is the employment of this facet that renders automated tuning and matching easy and reliable. Mathematically, if the mutual induction M is changed by a small amount dM and the capacitance C, 5, by a small amount dC such that the probe impedance changes from its desired resistive value Zp by an amount dZp, then it may be shown that:

$$dZp/Zp = 2dM/M - jQdC/C \qquad [1]$$

where $j = \sqrt{-1}$ and Q is the quality factor of the tuned circuit comprising 4,5 and 8. Clearly, change of M changes the effective resistance of the probe (the real part of the equation) while change of C changes the effective reactance of the probe (the imaginary part of the equation). With other probe designs, such as the well-known designs of FIGS. 2A and 2B, either or both of the resistive and reactive parts of the impedance depend on both variables.

The movement of inductor 6 to effect change in the mutual inductance is actuated by a hydraulic actuator 37 connected by hydraulic lines 36 to master piston 35, and controlled by motor 34 similar to the motor 30 so that again only hydraulic fluid is communicated to the interior of the magnet for effecting movement.

The bridge 10 is familiar to those skilled in radio frequency electronics and is available commercially. However, commercial products may contain ferrite transformers that saturate magnetically in the magnet's field. Thus either the cable 15 must be long enough that the bridge 10 is removed from the magnet or the bridge must be made from non-magnetic components. The bridge splits incoming radio frequency current at terminal presents at terminals 11 and 13. It also presents at terminal 14 a measure of the difference in the voltages between terminals 11 and 13. If these two terminals are terminated with equal impedances, the voltage at terminal 14 will therefore be zero; if the impedance presented to terminal 11 differs from that presented to terminal 13, the ensuing radio frequency voltage at terminal 14 will be representative, in its amplitude and phase, of the departure of the impedance presented at terminal 11 from the impedance presented at terminal 13, typically 50 ohms. (Note that the impedance of the probe 3 is modified by the coaxial cable 15 unless the former has an impedance equal to the characteristic impedance of the cable.) Measurement of the amplitude and phase of this error signal from terminal 14 is most conveniently accomplished by using the I-Q phase-sensitive detector of the receiver of the magnetic resonance instrument to hand. However, any I-Q phase-sensitive detector will suffice and will provide the required representative signals.

To summarize, the tuning and matching of the probe 3 may be varied by applying currents to the two electric motors 30 and 34 respectively, and as the values of capacitance 5 and the mutual inductance between coils 4 and matching coil 6 alter, so too does the radio frequency output of bridge 10 and its I-Q phase-sensitively detected counterparts, the D.C. outputs of the receiver at terminals 23 and 24. The output of the bridge is zero when the impedance of the probe is 50 ohms resistive, and then too the receiver outputs I and Q are also zero.

Figure 3:
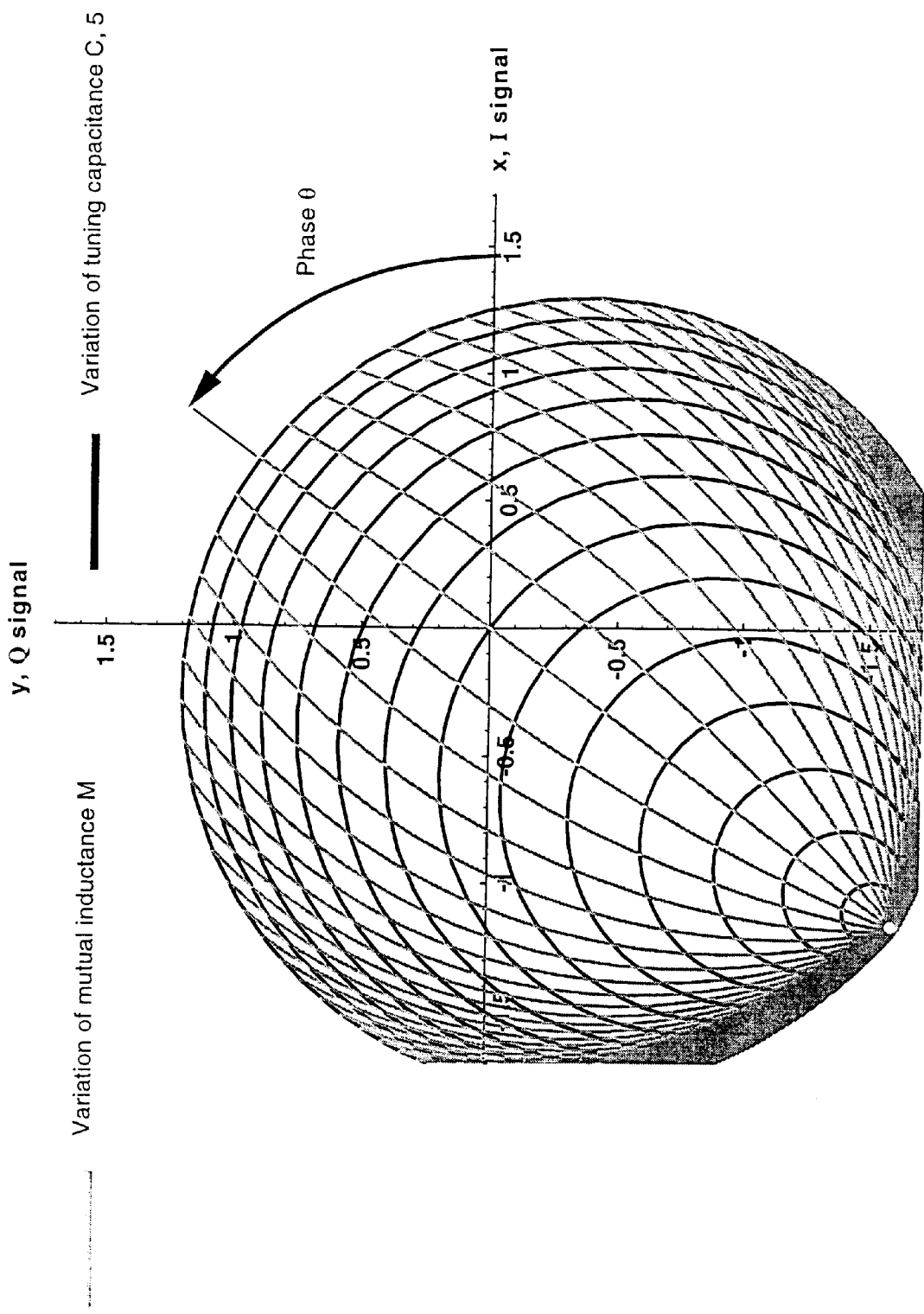
FIG. 3 is a graph of in-phase I and quadrature Q signals emanating from the I-Q demodulator in FIG. 1, showing the effect of variations in the circuit elements of the probe of FIG. 1. The two variables produce orthogonal deflections in the region about the origin; however, these deflections do not in general coincide with the principal axes of the figure.
Figure 4:
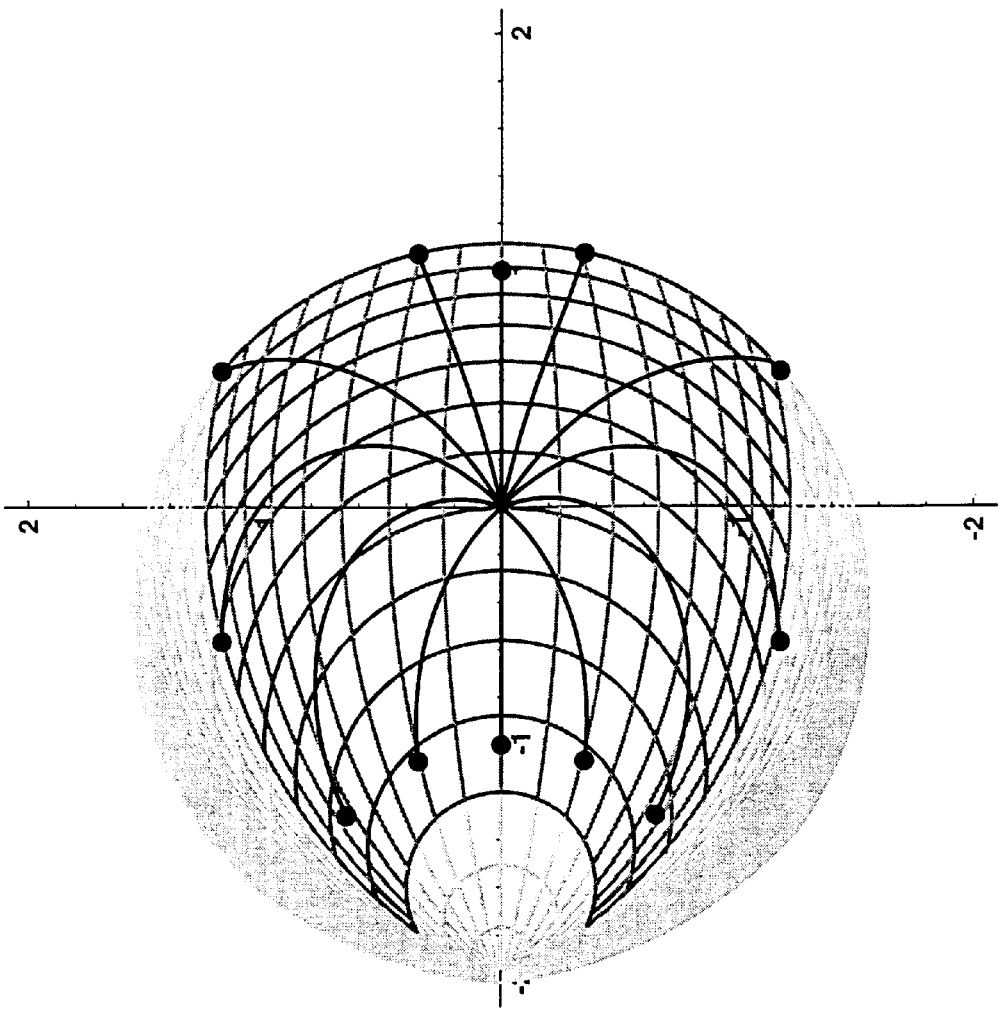
FIG. 4 is a graph similar to that of FIG. 3 showing a rotation of the effect of the variation of the circuit elements, obtained by changing the phase of the reference to the I-Q demodulator of FIG. 1. Also shown is the "pull-in" to the required impedance characteristics from various points on the graph when the impedance tuning and matching system is activated.

FIG. 3 shows the two outputs of the magnetic resonance receiver, displayed with the I signal from terminal 23 causing a deflection in the x direction and the Q signal from terminal 24 causing a deflection in the y direction, as the capacitor 5 and the probe mutual inductance are varied. It is obvious that the variables are independent in the region close to the origin, as the lines in the figure in this region are perpendicular. (At the origin there is no receiver output and the probe is "tuned and matched".) However, variation of the mutual inductance only (electric motor 34) from a previously "tuned and matched" state (the origin in FIG. 3) causes a deflection along a straight line at an angle to the x axis, as shown. This angle is the phase of the I-Q detection process, and in many magnetic resonance instruments, it is under the control of the operator via system control 27. An adjustment of the phase essentially rotates the display so that variation of the mutual inductance from a previously "tuned and matched" state can be set by the operator to cause a deflection along only the x axis as shown in FIG. 4. Then at least, in the region about the origin, the x deflection, the strength of the I signal, is a direct measure of the degree of mismatch (the error in mutual inductance) while the strength of the Q signal is a measure of the degree of mistuning (the error in capacitance 5). In essence, the signal I is now a measure of the real part of Equation [1] while the signal Q is a measure of the imaginary part of equation [1]. The degree to which the operator must adjust the phase of the I-Q detection process is dependent on the lengths of the coaxial cables 15, 16 and 18. Thus in the patent of Haragashira, where I and Q signals are also obtained, albeit in a distorted and compressed manner, by use of a standing wave bridge, the lengths of cables must be precisely set to obtain the correct phase, a very difficult task at ultra-high frequency. Thus the standing wave bridge is of use at only one frequency. The use of the 180° hybrid bridge 10, followed by phase adjustable I-Q detection removes these onerous restrictions.

Figure 5:
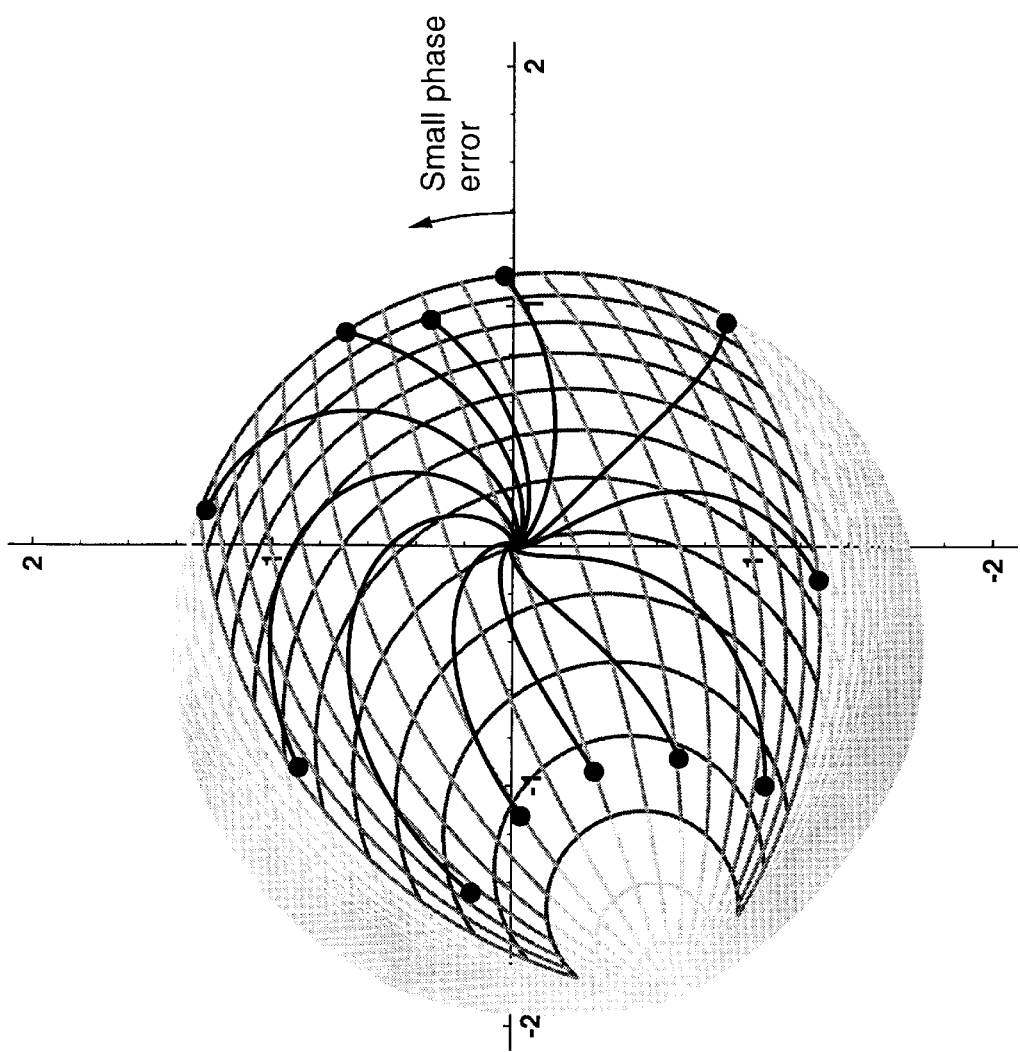
FIG. 5 is similar in to FIG. 4; however, slight error in phase has been added for realism.
Figure 6:
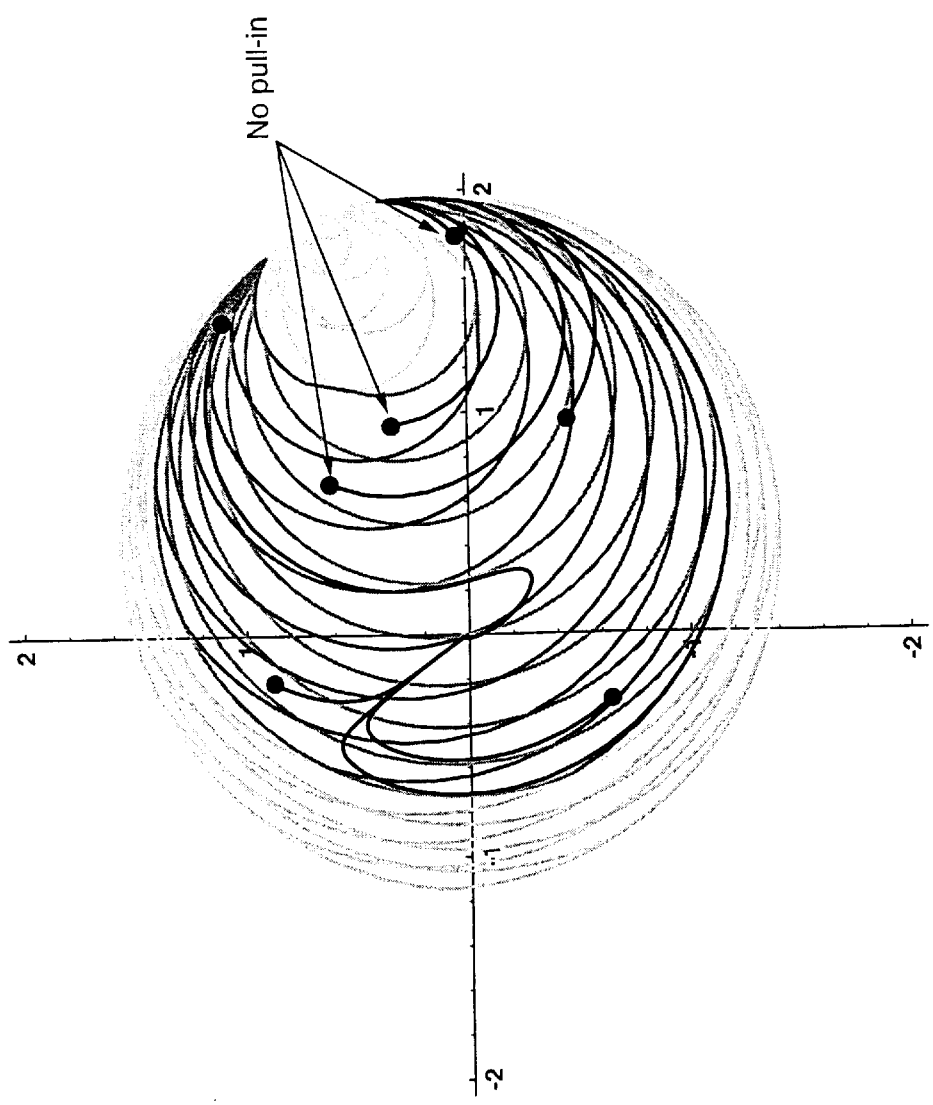
FIG. 6 shows a graph similar to that of FIG. 5, but employing the conventional probe of FIG. 2. The figure shows that the effects of variation of the circuit elements of the conventional probe are substantially parallel in the region about the origin, that "pull-in" is therefore convoluted and that at certain points far away from the origin, "pull-in" does not take place.

Having obtained two signals I and Q that are independently representative of the errors in the matching and tuning respectively, at least in the region about the origin in FIG. 4, these signals are used to correct the errors. Such correction may, of course, be implemented in a variety of ways, but a paradigm for such ways is to employ negative feedback so that the speed of motor 34 is determined by the strength of the I signal while the speed of motor 30 is determined by the strength of the Q signal. The polarity of connection of the motors is such that the errors are reduced in the presence of signals I and Q rather than enhanced. FIGS. 4 and 5 shows that under such circumstances, the probe unambiguously attains a "tune and matched" condition, the solid lines in the figures showing the trajectories of the "pull-in" from various erroneous starting points. For verisimilitude, a small phase error has been deliberately introduced into the detection process in FIG. 5, but it has little effect on the efficacy of the pull-in process. By contrast, FIG. 6 demonstrates the pull-in (or lack of it) when either of the probes of FIG. 2, one of which was employed by Haragashira, are employed in place of the probe 3. It is immediately apparent in the figure that there is no orthogonality in the plot about the origin. Indeed, change of matching and tuning both cause deflections in mostly the y direction. Thus one cannot obtain I and Q signals that are independently representative of the errors respectively in matching and tuning, and the pull-in suffers accordingly to the extent that it is highly convoluted and hence slow. Worse, there are erroneous conditions from which pull-in to the origin is impossible.

Figure 7:
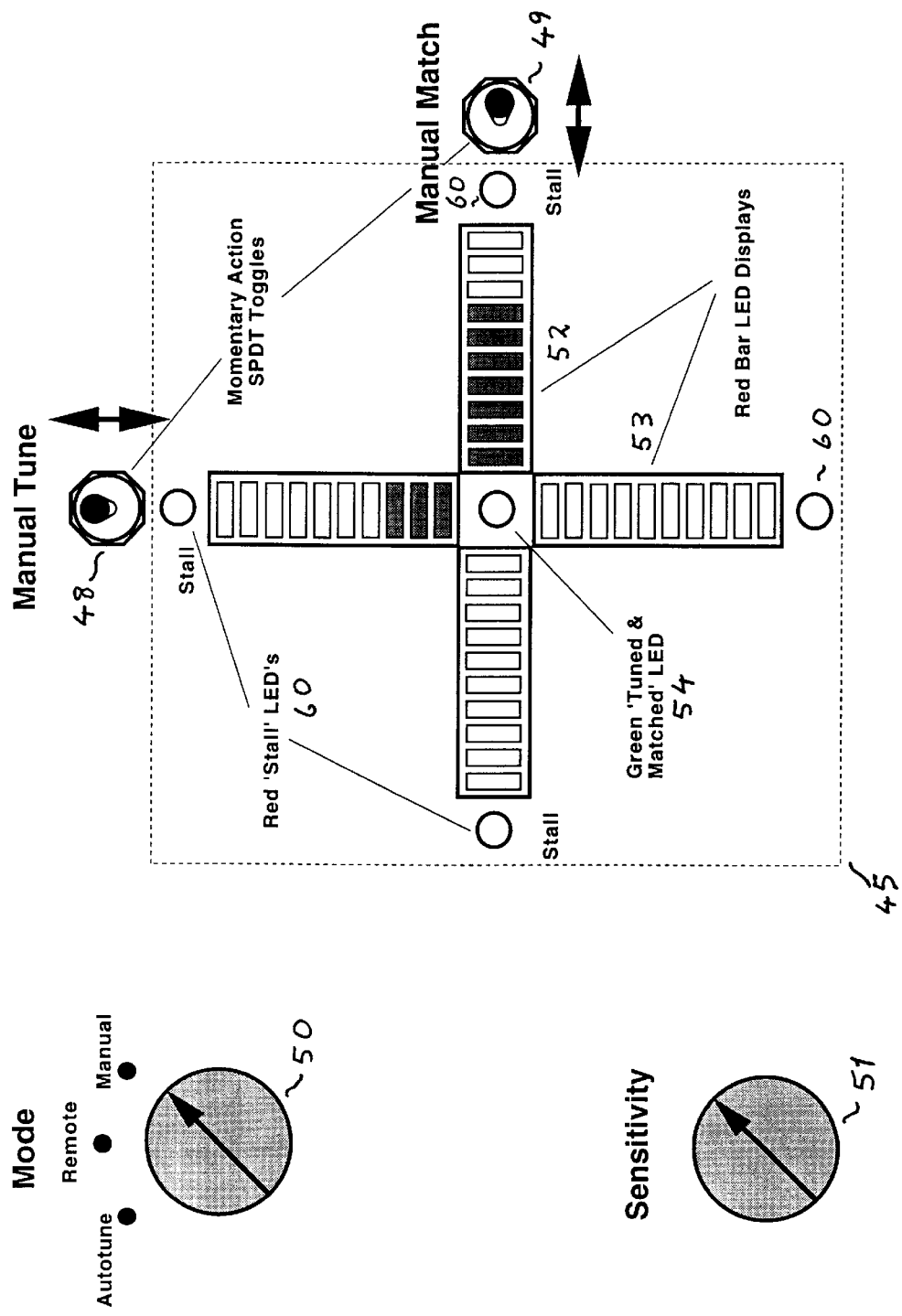
FIG. 7 is a front elevational view showing schematically a portion of the control and display element of the system of FIG. 1.

As has been previously stated, there are various ways in which the error signals I and Q may be used to correct the errors in matching and tuning. A simple and effective way will now be described in which the motors 34 and 30 run at constant speed until the signals I and Q are close enough to zero to satisfy the operator. The motors 30 and 34 are controlled by a tuning and matching control system 40. The control system 40 has a front panel face as shown in FIG. 7 and includes a display 45, an automatic control element 46 and a manual control system 47. The automatic control element 46 allows the functioning of the instrument to be controlled remotely by, for example, a computer if so desired. The manual system 47 comprises a pair of toggle switches 48 and 49 each of which can be actuated manually to directly control the motors 30, 34 via connections from terminals 41 and 42 respectively. These manual controls override both the automatic control element and any control that the error signals I and Q may be exerting. Also present is a three way switch 50 that either: 1. turns control of the motors to signals I and Q ("autotune" mode); 2. turns control over to the remote computer ("remote" mode); or 3. allows manual control only ("manual" mode). The system further includes a variable potentiometer 51 for effecting control of the sensitivity. This control determines at what absolute value of the voltages I and Q the motors begin turning. Thus with the control turned fully clockwise, the motor 34 will turn clockwise if the voltage I, which is available at terminal 43, is greater than 100 mV. The motor 34 will be stationary if the voltage I is between −100 and +100 mV and will turn anti clockwise if the voltage I is less than −100 mV. The motor 30 is controlled in similar fashion by the error signal Q available at terminal 44. The gain of the magnetic resonance receiver is such that a voltage of 100 mV constitutes a departure of the probe impedance from 50 ohms by less than 1%. However, if for some reason, such as inertia in the motors, the system should oscillate, the sensitivity 51 may be reduced so that the turn-off of the motors occurs at a greater absolute voltage—say 500 mV.

It is clear that setting correctly the phase of the I-Q detection process prior to use of the instrument is crucial to its correct functioning. The display system shown in FIG. 7 aids in the setting. The display 45 comprises two perpendicular rows of bar light-emitting diodes (LEDs) indicated at 52 and 53 respectively together with a central green circular LED 54 which is intended to indicate a tuned and matched position. The bar LEDs extend outwardly in both directions from the central single LED 54 and the horizontal bars are illuminated in proportion to the I error signal, while the vertical bars are illuminated in proportion to the Q error signal. Both positive and negative values of I and Q are accommodated with this display system, as may be seen. The phase is set by first manually attaining a tuned and matched condition. The switch 49 is then pushed to the right which causes a mismatched condition as motor 34 changes the mutual inductance in the probe 3 from its optimal value. The phase is correctly set by the operator via system control 27 when the illumination of the LEDs is only to the right horizontally (see FIG. 4). The vertical display must show no illumination. Activation of the feedback ("autotune" mode), by allowing error signals I and 0 to control the motors 34 and 30 respectively through the throwing of switch 50, should now cause the bar display to "shrink". When a tuned and matched condition is attained, as set by the sensitivity control 51, no bar LEDs are illuminated and with the cessation of motor movement, the green LED 54 is illuminated. At the end of each set of bar LEDs is provided a further respective one of four LEDs indicated at 60 each indicative of a stall position of the motor to indicate to the user if, for some reason, the extreme of the range of adjustment has been attained.

The present inventor has therefore realized that, in order to obtain an effective probe impedance adjustment system which can be readily automated, the movement of a first element of the adjustment system (for example, the capacitor 5) that changes the impedance of the probe from its desired value to a new value must have no effect, to first mathematical order, upon that dependent variable (for example, the effective probe resistance) which is representative of the value of the second element of the adjustment system. Conversely, the movement of the second element of the adjustment system (for example, the mutual inductance of the probe 3) that changes the impedance of the probe from its desired value to a second new value must have no effect, to first mathematical order, upon that dependent variable (for example, the effective probe reactance) which is representative of the value of the first element of the adjustment system. In short, the inventor has realized that adjustments must be approximately orthogonal in that region of impedance that is close to the desired impedance value if an automated tuning and matching system is to work satisfactorily and it is with that realization that the known circuit for the probe 3 of FIG. 1 has been chosen.

Given derived orthogonal error signals I and Q that are representative of the two aforesaid orthogonal dependent variables, and knowing that arbitrary cable lengths can cause to be generated an admixture thereof, for example:

$$I'=(I\cos\theta+Q\sin\theta) \text{ and } Q'=(-I\sin\theta+Q\cos\theta) \qquad [2]$$

where q is an arbitrary angle, the present inventor has thus further realized that this impediment to the functioning of an otherwise working automated tuning and matching system may be removed by rotation of the variables I' and Q' by an angle -q, thereby changing their phase. Thus new variables I" and Q" are formed given by:

$$I''=(I'\cos\theta-Q'\sin\theta)=I;\ Q''=(I'\sin\theta+Q'\cos\theta)=Q \qquad [3]$$

and this manipulation restores the desired error signals.

The present inventor has further realized that a convenient manner of generating the aforesaid, correctly phased, error signals I and Q is with the aid of a 180° hybrid bridge and an I-Q detector whose reference phase can be controlled.

The present inventor has yet further realized that if I and Q signals are derived from a device with no phase adjustment, such as a standing wave bridge which is attached to the probe 3 by an incorrect length of coaxial cable so that the I and Q signals are rotated and therefore representative of an admixture of the desired orthogonal variables, as exhibited in Equation [2], it is possible to backrotate the aforesaid signals to their correct positions with circuitry that effectively implements Equation [3]. Such a circuit has recently been published by the inventor and is cited above.

Since various modifications can be made in my invention as herein above described, and many apparently widely different embodiments of same made within the spirit and scope of the claims without departing from such spirit and scope, it is intended that all matter contained in the accompanying specification shall be interpreted as illustrative only and not in a limiting sense.

For example, it is appreciated by the inventor that other methods of orthogonalisation of tuning and matching variables, apart from selection of the probe of the type 3 shown in FIG. 1, are possible, and such methods are envisaged to be in the scope of this application. For examples: a probe of type 3 may be tuned by variation of the coil inductance rather than variation of the capacitor 5; a theoretical analysis has shown that with the probes of FIG. 2, a variation of the tuning capacitor(s) that simultaneously, by mechanical means, changes the matching capacitor by a prescribed amount (a third variable capacitor may be in parallel with the first matching capacitor), can substantially improve orthogonality.

It is further appreciated by the inventor that the functioning of analogue electronic circuitry, of the type described in the present application that controls the motors 30 and 34, can be mimicked by digital electronic circuitry, including the computer attached to magnetic resonance instruments. Thus the use with an orthogonalised probe of computational and digital techniques to adjust automatically its tuning and matching is envisaged to be within the scope of the invention.

What is claimed is:

1. A method for adjusting an impedance of a nuclear magnetic resonance probe in nuclear magnetic resonance experiments comprising:

providing a source of a high frequency oscillating current suitable for use in the nuclear magnetic resonance experiments, the source having a required characteristic impedance;

providing the nuclear magnetic resonance probe to be connected to the source for generating an electromagnetic field suitable for use in the nuclear magnetic resonance experiments in response to the current, the nuclear magnetic resonance probe having an impedance different from said required characteristic impedance;

wherein the nuclear magnetic resonance probe comprises a transmitter inductor coil for generating the electromagnetic field connected in parallel with a variable capacitor, a subsidiary inductor coil arranged for variable mutual inductance between the transmitter inductor coil and the subsidiary inductor coil and a second capacitor connected in series with the subsidiary inductor, the current being connected from the source in series with the subsidiary inductor coil and the second capacitor;

arranging the variable capacitor and the variable mutual inductance such that the adjustment of each causes adjustment of both a resistive component and a reactive component of the impedance and such that, over at least a part of a range of adjustment of the variable capacitor and the variable mutual inductance, adjustment of the variable capacitor while the variable mutual inductance remains constant generates a change in the impedance which is substantially orthogonal to a change in the impedance obtained by adjustment of the variable mutual inductance while the variable capacitor remains constant and such that adjustment of the variable capacitor to a first required adjustment position and adjustment of the variable mutual inductance to a second required adjustment position causes the impedance of the probe to be adjusted to said required characteristic impedance;

providing a detection circuit responsive to the impedance of the probe and causing the detection circuit to provide first and second separate output values which are orthogonal to one another and which are indicative of a difference in the impedance of the probe from said required characteristic impedance;

arranging the output values such that the first is indicative of a difference of the variable capacitor from the first required adjustment position and such that the second is indicative of a difference of the variable mutual inductance from the second required adjustment position;

and using the first and second output values for controlling respectively the variable capacitor and the variable mutual inductance.

2. The method according to claim 1 wherein the variable capacitor and the variable mutual inductance are arranged such that the parts of their ranges at which the changes are orthogonal encompass the first and second required adjustment positions that give the required characteristic impedance.

3. The method according to claim 1 wherein the variable capacitor and the variable mutual inductance are arranged such that, at no points in the range, are the changes obtained by adjustment of the variable capacitor and the variable mutual inductance substantially parallel.

4. The method according to claim 1 wherein e first and second values are arranged such that each is separately indicative of a respective one of the resistive and reactive components of the impedance.

5. The method according to claim 1 including providing an orthogonal display of the first and second values.

6. The method according to claim 1 wherein said first and second separate output values of the detection circuit are derived from an oscillating signal subject to in-phase and quadrature (I/Q) phase-sensitive detection.

7. The method according to claim 6 wherein the oscillating signal is derived from a 180° hybrid bridge.

8. The method according to claim 1 wherein each adjustment element of the adjustment circuit comprises an individual component of the circuit, the value of which can be adjusted independently of the other of the components.

9. The method according to claim 1 wherein the variable capacitor and the variable mutual inductance are arranged such that, over at least a part of a range of adjustment of the vaiable capacitor and the variable mutual inductance, the movement of the variable capacitor that changes the impedance of the probe from its desired value to a new value has no effect, to first mathematical order, upon that dependent variable which is representative of the value of the variable mutual inductance and the movement of the variable mutual inductance that changes the impedance of the probe from its desired value to a second new value has no effect, to first mathematical order, upon that dependent variable which is representative of the value of the variable capacitor.

10. The method according to claim 1 wherein the first and second values are linearly combined to produce new first and second values, still mutually orthogonal, such that each is separately indicative of a respective one of the variable capacitor and the variable mutual inductance.

11. The method according to claim 1 wherein the detection circuit generates an oscillating signal that is analyzed to generate said first and second separate output values using in phase and quadrature (I/Q) phase sensitive detection and wherein the phase of the detection process is adjusted such that the first value I is representative of a difference of the variable capacitor from the first required adjustment position and such that the second value Q is representative of a difference of the variable mutual inductance from the second required adjustment position.

* * * * *